(12) United States Patent
Li et al.

(10) Patent No.: US 9,640,770 B2
(45) Date of Patent: May 2, 2017

(54) N-TYPE THIN FILM TRANSISTOR

(71) Applicants: Tsinghua University, Beijing (CN); HON HAI PRECISION INDUSTRY CO., LTD., New Taipei (TW)

(72) Inventors: Guan-Hong Li, Beijing (CN); Qun-Qing Li, Beijing (CN); Yuan-Hao Jin, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/985,224

(22) Filed: Dec. 30, 2015

(65) Prior Publication Data

US 2016/0190490 A1 Jun. 30, 2016

(30) Foreign Application Priority Data

Dec. 31, 2014 (CN) .......................... 2014 1 0848447

(51) Int. Cl.
*H01L 51/00* (2006.01)
*H01L 51/05* (2006.01)
*B82Y 10/00* (2011.01)

(52) U.S. Cl.
CPC ...... *H01L 51/0525* (2013.01); *H01L 51/0048* (2013.01); *H01L 51/0529* (2013.01); *H01L 51/0545* (2013.01); *H01L 51/0558* (2013.01); *B82Y 10/00* (2013.01)

(58) Field of Classification Search
CPC ............. H01L 51/0525; H01L 51/0529; H01L 51/0048; H01L 51/0558; H01L 51/0545; B82Y 10/00; B82Y 30/00; B82Y 40/00
See application file for complete search history.

(56) References Cited

U.S. PATENT DOCUMENTS

| | | | |
|---|---|---|---|
| 7,800,139 | B2 | 9/2010 | Lee et al. |
| 9,171,942 | B2 | 10/2015 | Mochizuki et al. |
| 2006/0006377 | A1 | 1/2006 | Golovchenko et al. |
| 2008/0017849 | A1 | 1/2008 | Yukawa et al. |
| 2009/0200912 | A1 | 8/2009 | Ren et al. |

(Continued)

FOREIGN PATENT DOCUMENTS

| | | |
|---|---|---|
| TW | 201246309 | 11/2012 |
| TW | 201306137 | 2/2013 |

OTHER PUBLICATIONS

Radosavljevic et al., "High Performance of Potassium n-Doped Carbon Nanotube Field Transistors", Applied Physic Letters, vol. 84, No. 18, pp. 3693-3695, May 3, 2004.*

(Continued)

*Primary Examiner* — Nikolay Yushin
(74) *Attorney, Agent, or Firm* — Steven Reiss

(57) ABSTRACT

An thin film transistor includes an insulating substrate, an MgO layer, a semiconductor carbon nanotube layer, a functional dielectric layer, a source electrode, a drain electrode, and a gate electrode. The semiconductor carbon nanotube layer is sandwiched between the MgO layer and the functional dielectric layer. The source electrode and the drain electrode electrically connect the semiconductor carbon nanotube layer. The gate electrode is sandwiched between the insulating substrate and the MgO layer.

15 Claims, 7 Drawing Sheets

(56) References Cited

U.S. PATENT DOCUMENTS

| | | |
|---|---|---|
| 2009/0246408 A1 | 10/2009 | Chan et al. |
| 2011/0068324 A1 | 3/2011 | Matsumoto et al. |
| 2012/0280213 A1 | 11/2012 | Gau et al. |
| 2012/0302003 A1 | 11/2012 | Shieh et al. |
| 2016/0043152 A1* | 2/2016 | Tian .................. H01L 29/78696 257/27 |

OTHER PUBLICATIONS

Xiao et al., "High-Mobility Thin-Film Transistors Based on Aligned Carbon Nanotubes", Applied Physics Letters, vol. 83, No. 1, pp. 150-152, Jul. 7, 2003.*

* cited by examiner

N-TYPE THIN FILM TRANSISTOR

This application claims all benefits accruing under 35 U.S.C. §119 from China Patent Application No. 201410848447.4, filed on Dec. 31, 2014 in the China Intellectual Property Office, the contents of which are hereby incorporated by reference.

BACKGROUND

1. Technical Field

The present invention relates to an N-type thin film transistor.

2. Description of Related Art

Carbon nanotubes, because of its excellent electrical, optical and mechanical properties, has become a strong contender for next-generation semiconductor materials, has been widely used in the preparation and study of thin film transistor (TFT). Scientific research shows that the carbon nanotubes are configured as an intrinsic semiconductor. However, under normal circumstances, such as air, the carbon nanotubes behave as P-type semiconductor characteristics. Thus it is easy to prepare P-type thin film transistors with carbon nanotubes. But the integrated circuits with merely the P-type thin film transistor will greatly reduce the associated performance of the integrated circuits, and increase loss.

The method of making N-type thin film transistor with carbon nanotubes comprises chemical doping, selecting low-work function metal deposition as electrode. However, there are some problems in these methods. The chemical doping methods can not maintain long-term and stable of the device performance. In addition, there is a potential drawback dopant diffusion of pollution. In the thin film transistor adopting low function metal as electrode, the N-type unipolar characteristic is not obvious.

What is needed, therefore, is an N-type TFT that can overcome the above-described shortcomings.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
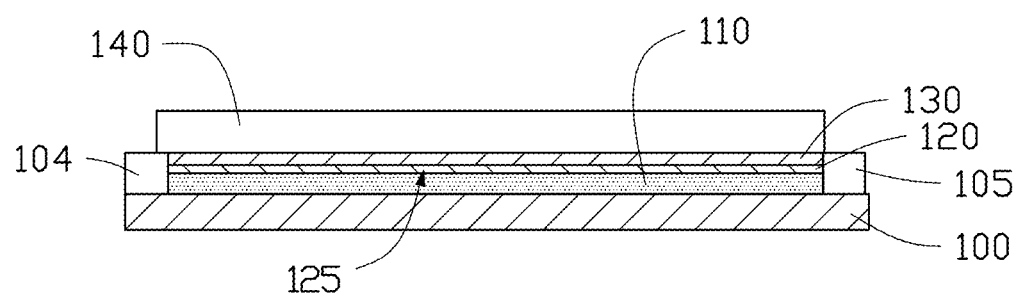
FIG. 1 is a cross-section view of one embodiment of an N-type TFT.

Referring to FIG. 1, one embodiment of an N-type thin film transistor (TFT) 10 comprises a MgO layer 110, a semiconductor carbon nanotube layer 120, a functional dielectric layer 130, a gate electrode 140 stacked on an insulating substrate 100 in that sequence. A source electrode 104 and a drain electrode 105 are electrically connected to the semiconductor carbon nanotube layer 120. The MgO layer 110 is sandwiched between the semiconductor carbon nanotube layer and the insulating substrate 100. A channel 125 is defined in the semiconductor carbon nanotube layer 120 between the source electrode 104 and the drain electrode 105.

A material of the insulating substrate 100 can be hard material or flexible material. The hard material can be as glass, quartz, ceramics, or diamond. The flexible material can be plastics or resins. The flexible material can also be polyethylene terephthalate, polyethylene naphthalate, polyethylene terephthalate, or polyimide. In one embodiment, the material of the insulating substrate 100 is polyethylene terephthalate. The insulating substrate 100 is used to support the different elements on the insulating substrate 100.

The MgO layer 110 can entirely cover the surface of the insulating substrate 100. The MgO layer 110 is in direct contact with the semiconductor carbon nanotube layer 120. The MgO layer 110 is configured to modulate the semiconductor carbon nanotube layer 120, reduce holes, and improve electrons in the semiconductor carbon nanotube layer 120. A thickness of the MgO layer 110 can range from about 1 nanometer to about 15 nanometers. In one embodiment, the thickness of the MgO layer 110 ranges from about 1 nanometers to about 10 nanometers. While the thickness of the MgO layer 110 is smaller than 1 nanometer, the MgO layer 110 cannot effectively isolated the air and water molecular from the semiconductor carbon nanotube layer 120, and the structure of TFT cannot sustain the stability; while the thickness of the MgO layer 110 is greater than 15 nanometers, the holes in the semiconductor carbon nanotube layer 120 cannot be effectively reduced, and the modulation efficiency of TFT will be dramatically reduced. In one embodiment, the thickness of the MgO layer 110 is about 1 nanometer.

The semiconductor carbon nanotube layer 120 is located on the MgO layer 110. The semiconductor carbon nanotube layer 120 is in direct contact with the MgO layer 110. Furthermore, the semiconductor carbon nanotube layer 120 is sandwiched between the MgO layer 110 and the functional dielectric layer 130. The semiconductor carbon nanotube layer 120 comprises a first surface and a second surface opposite to the first surface. At least 80% of the first surface is coated with the MgO layer 110. Furthermore, entire the first surface can be covered by the MgO layer 110. In one embodiment, the semiconductor carbon nanotube layer 120 is located within coverage of the MgO layer 110. Thus the first surface is completely covered by the MgO layer 110. Furthermore, the semiconductor carbon nanotube layer 120 is sealed by the MgO layer 110 and the functional dielectric layer 130. Thus the semiconductor carbon nanotube layer 120 can be completely isolated from air and water molecular.

The semiconductor carbon nanotube layer 120 comprises a plurality of carbon nanotubes. The semiconductor carbon nanotube layer 120 has semi-conductive property. The semiconductor carbon nanotube layer 120 can consist of a plurality of semi-conductive carbon nanotubes. In one embodiment, a few metallic carbon nanotubes can be existed in the semiconductor carbon nanotube layer 120, but the metallic carbon nanotubes cannot affect the semi-conductive property of the semiconductor carbon nanotube layer 120.

The plurality of carbon nanotubes are connected with each other to form a conductive network. The carbon nanotubes of the semiconductor carbon nanotube layer 120 can be orderly arranged to form an ordered carbon nanotube structure or disorderly arranged to form a disordered carbon nanotube structure. The term 'disordered carbon nanotube structure' includes, but is not limited to, a structure where the carbon nanotubes are arranged along many different directions, and the aligning directions of the carbon nanotubes are random. The number of the carbon nanotubes arranged along each different direction can be substantially the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotubes in the semiconductor carbon nanotube layer 120 are arranged to extend along the direction substantially parallel to the surface of the carbon nanotube layer. In one embodiment, all the carbon nanotubes in the semiconductor carbon nanotube layer 120 are arranged to extend along the same direction. In another embodiment, some of the carbon nanotubes in the carbon nanotube layer are arranged to extend along a first direction, and some of the carbon nanotubes in the semiconductor carbon nanotube layer 120 are arranged to extend along a second direction, perpendicular to the first direction.

In one embodiment, the semiconductor carbon nanotube layer 120 is a free-standing structure and can be drawn from a carbon nanotube array. The term "free-standing structure" means that the semiconductor carbon nanotube layer 120 can sustain the weight of itself when it is hoisted by a portion thereof without any significant damage to its structural integrity. Thus, the semiconductor carbon nanotube layer 120 can be suspended by two spaced supports. The free-standing semiconductor carbon nanotube layer 120 can be laid on the insulating layer 104 directly and easily. In one embodiment, the semiconductor carbon nanotube layer 120 can be formed on a surface of insulated support (not shown).

The semiconductor carbon nanotube layer 120 can be a substantially pure structure of the carbon nanotubes, with few impurities and chemical functional groups. The semiconductor carbon nanotube layer 120 can also be composed of a combination of semi-conductive and metallic carbon nanotubes obtained via chemical vapor deposition. The ratio between semi-conductive and metallic of carbon nanotubes is 2:1, and the percentage of the semi-conductive carbon nanotubes is about 66.7% in the combination. In one embodiment, all of the metallic carbon nanotubes can be completely removed via chemical separation method. In another embodiment, most of the metallic carbon nanotubes are removed, and there are a few metallic carbon nanotubes left. Furthermore, the percentage of the semi-conductive carbon nanotubes in the semiconductor carbon nanotube layer 120 ranges from about 90% to about 100%. The semiconductor carbon nanotube layer 120 has good semi-conductive property. In one embodiment, the semiconductor carbon nanotube layer 120 consists of a plurality of single-walled carbon nanotubes. The plurality of single-walled carbon nanotubes are parallel with each other. A diameter of the carbon nanotube is smaller than 2 nanometers. A thickness of the semiconductor carbon nanotube layer 120 ranges from about 0.5 nanometers to about 2 nanometers. A length of the carbon nanotube ranges from about 2 micrometers to about 4 micrometers. In one embodiment, the diameter of the carbon nanotube is greater than 0.9 nanometers and smaller than 1.4 nanometers.

Figure 2:
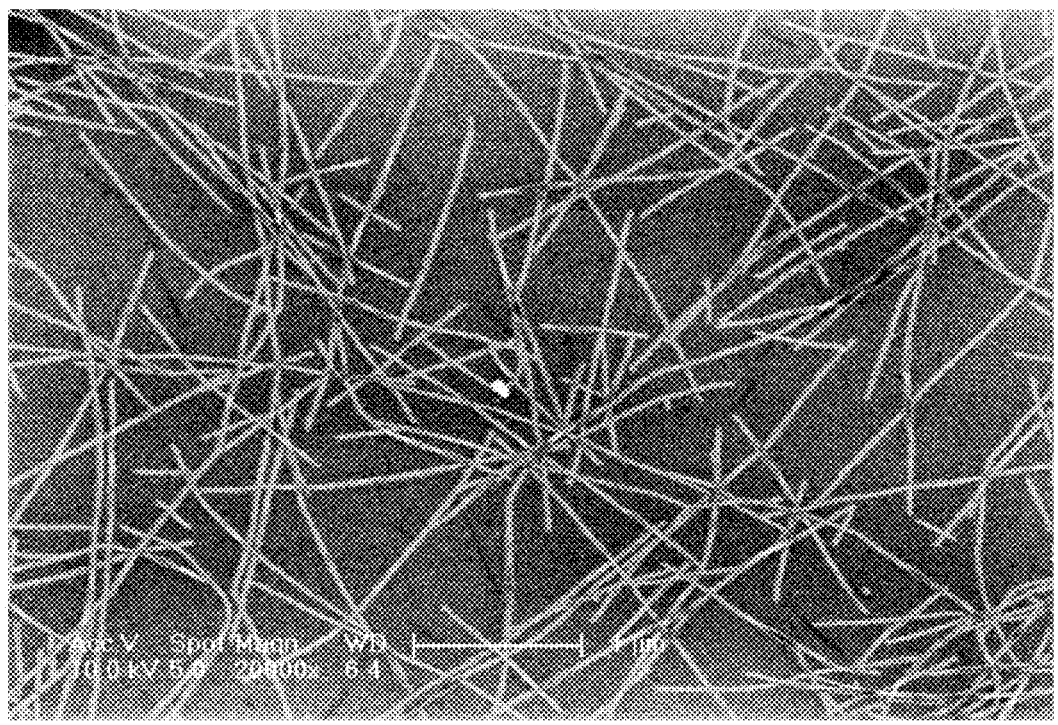
FIG. 2 shows a scanning electron microscope (SEM) view of a semiconductor carbon nanotube film.

Referring to FIG. 2, in one embodiment, the semiconductor carbon nanotube layer 120 consists of the single-walled carbon nanotubes, and the percentage of the semi-conductive carbon nanotubes in the semiconductor carbon nanotube layer 120 is about 98%. The plurality of single-walled carbon nanotubes are entangled with each other to form the conductive network. A plurality of apertures are defined in the semiconductor carbon nanotube layer 120, and the MgO layer 110 can be embedded into the plurality of semiconductor carbon nanotube layer 120 to form an integrated structure. The diameter of the single-walled carbon nanotube is about 1.2 nanometers. The thickness of the semiconductor carbon nanotube layer 120 is about 1.2 nanometers.

The functional dielectric layer 130 is located on the second surface of the semiconductor carbon nanotube layer 120. In one embodiment, the functional dielectric layer 130 covers entire the second surface. The term "functional dielectric layer" includes, but is not limited to, that the functional dielectric layer 130 can dope the semiconductor carbon nanotube layer 120 under the affect of the MgO layer 110. Furthermore, the functional dielectric layer 130 is insulating and can isolate the semiconductor carbon nanotube layer 120 from oxygen and water molecular. Thus the semiconductor carbon nanotube layer 120 has N-type property. A material of the functional dielectric layer 130 can be aluminum oxide, hafnium oxide, or yttrium oxide.

The functional dielectric layer 130 has high density, thus the functional dielectric layer 130 can isolate the air and the water molecular. Furthermore, the functional dielectric layer 130 lacks positive charges, thus the semiconductor carbon nanotube layer 120 can be doped with electrons, and the semiconductor carbon nanotube layer 120 has N-type property. A thickness of the functional dielectric layer 130 can range from about 20 nanometers to about 40 nanometers. In one embodiment, the thickness of the functional dielectric layer 130 ranges from about 25 nanometers to about 30 nanometers. While the thickness of the functional dielectric layer 130 is too small, such as smaller than 20 nanometer, the functional dielectric layer 130 cannot isolate the air and water molecular. While the thickness is greater than 40 nanometers, the semiconductor carbon nanotube layer 120 cannot be effectively modulated. In one embodiment, the material of the functional dielectric layer 130 is aluminum oxide, and the thickness is about 30 nanometers.

The functional dielectric layer 130 and the MgO layer 110 form a double-layered functional dielectric layer, and cover the first surface and the second surface of the semiconductor carbon nanotube layer 120 respectively. Therefore, the semiconductor carbon nanotube layer 120 can have N-type property. In detail, the MgO layer 110 can absorb residual air and moisture in the semiconductor carbon nanotube layer 120 to reduce the P-type property. Furthermore, the function dielectric layer 130 has high density and lacks positive charges, thus the functional dielectric layer 130 can provide electrons to the semiconductor carbon nanotube layer 120, and the N-type property of the semiconductor carbon nanotube layer 120 can be improved.

The material of the source electrode 104 and the drain electrode 105 can be metal, alloy, indium tin oxide (ITO), antimony tin oxide (ATO), silver paste, conductive polymer, or metallic carbon nanotubes. The metal or alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metal. In one embodiment, the material of the source electrode 104 and the drain electrode 105 can comprises Au and Ti. The thickness of the Ti is about 2 nanometers, and the thickness of the Au is about 50 nanometers. In one embodiment, the source electrode 104 and the drain electrode 105 are located on opposite edges of the insulating substrate 100, and electrically connected to the semiconductor carbon nanotube layer 120. Thus a channel 125 is defined between the source electrode 104 and the drain electrode 105.

The gate electrode 140 is formed on the functional dielectric layer 130 and spaced from the semiconductor carbon nanotube layer 120. The material of the gate electrode 140 can be metal, alloy, indium tin oxide (ITO), antimony tin oxide (ATO), silver paste, conductive polymer, or metallic carbon nanotubes. The metal or alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metal. In one embodiment, the material of the gate electrode 140 can comprises Au and Ti. A length of the gate electrode 140 can be smaller than the length of channel 125. The thickness of the Ti is about 2 nanometers, and the thickness of the Au is about 50 nanometers.

In use, the source electrode is grounded. A voltage $V_d$ is applied to the drain electrode. Another voltage $V_g$ is applied on the gate electrode. The voltage $V_g$ forming an electric field in the channel of semiconductor carbon nanotube layer. Accordingly, carriers exist in the channel near the gate electrode. As the $V_g$ increasing, a current is generated and flows through the channel. Thus, the source electrode and the drain electrode are electrically connected.

Figure 3:
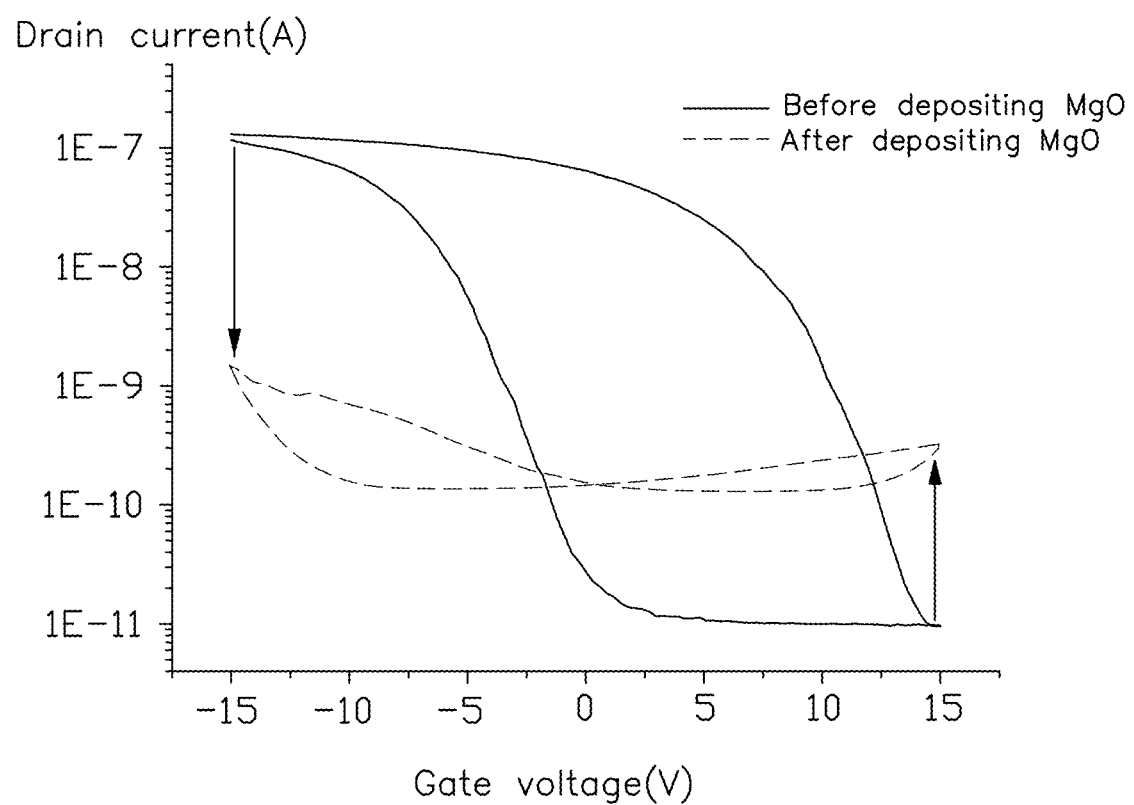
FIG. 3 shows a schematic view of an I-V graph of TFT before and after depositing MgO.

Referring to FIG. 3, an I-V graph of a TFT before and after depositing the MgO layer 110 is provided. The P-type property is reduced, and N-type property is improved after depositing MgO.

Figure 4:
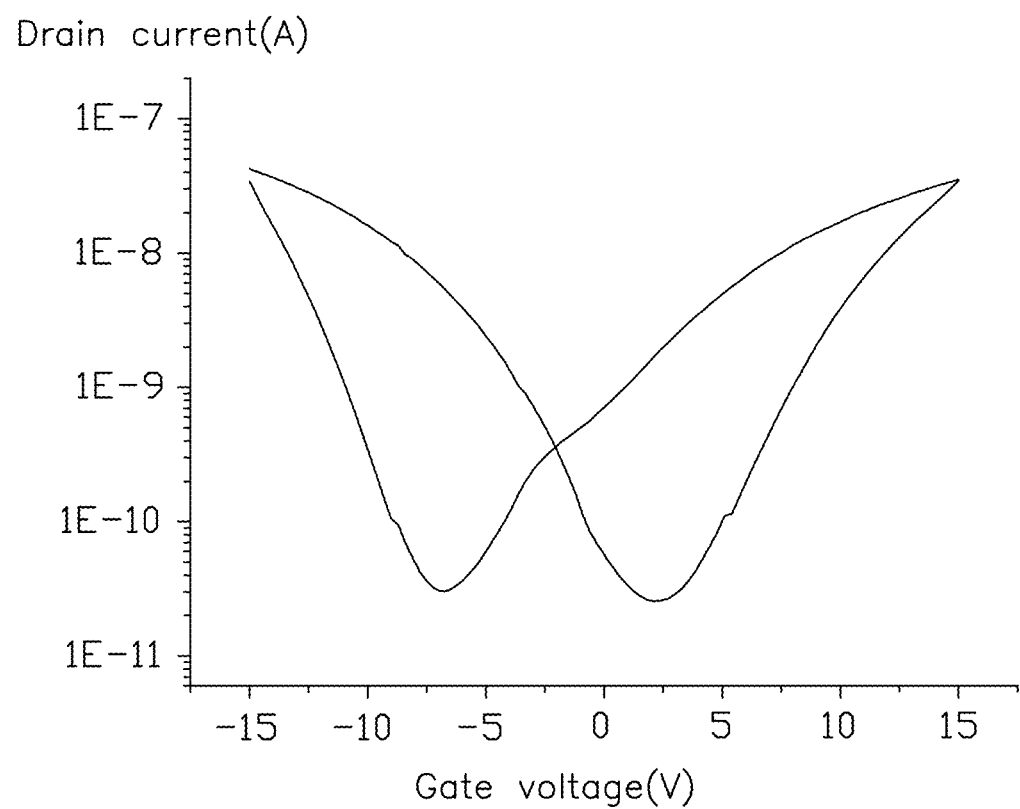
FIG. 4 shows a schematic view of an I-V graph of TFT deposited with a functional dielectric layer.

Referring to FIG. 4, an I-V graph of a TFT of depositing the functional dielectric layer 130 but without the MgO layer 110 is provided. The N-type property is improved, but the P-type property is not changed. Thus the TFT has bipolar property.

Figure 5:
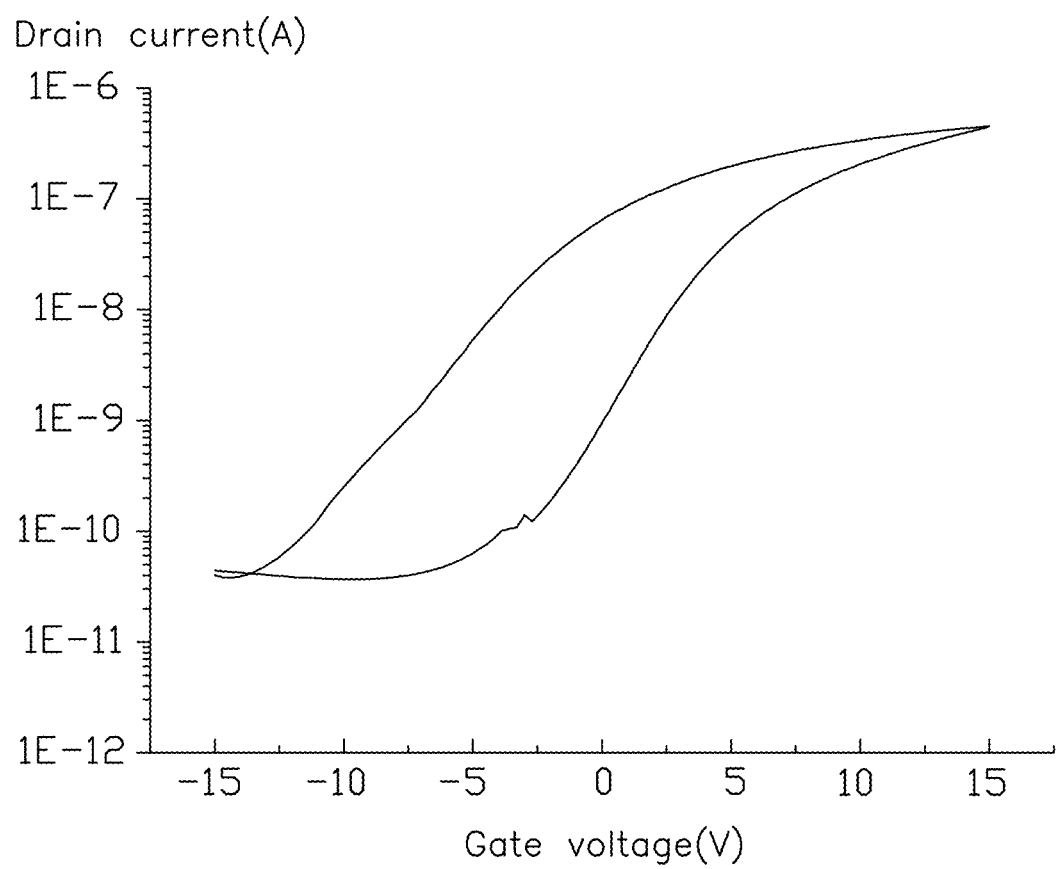
FIG. 5 shows a schematic view of an I-V graph of one embodiment of the N-type TFT.

Referring to FIG. 5, an I-V graph of the TFT of one embodiment with the MgO layer and the functional dielectric layer shows that the TFT has great N-type property.

The N-type TFT has following advantages. The two opposite surfaces of the semiconductor carbon nanotube layer is coated with the MgO layer and the functional dielectric layer, and the TFT has N-type property. The TFT has great stability. Thus the lifespan of the TFT is prolonged.

Figure 6:
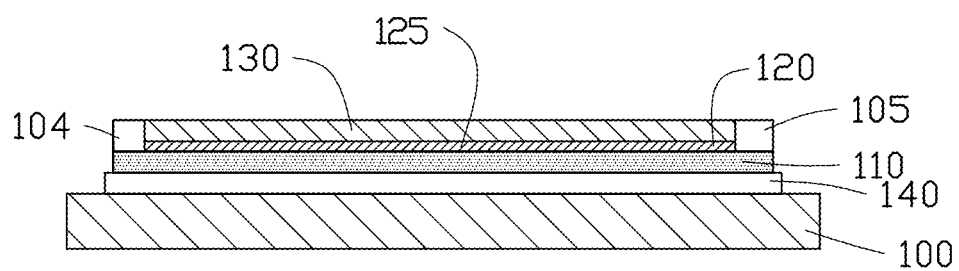
FIG. 6 is a cross-section view of one embodiment of an N-type TFT.

Referring to FIG. 6, one embodiment of an N-type thin film transistor (TFT) 20 comprises a gate electrode 140, a MgO layer 110, a semiconductor carbon nanotube layer 120, and a functional dielectric layer 130 stacked on an insulating substrate 100 in that sequence. A source electrode 104 and a drain electrode 105 are electrically connected to the semiconductor carbon nanotube layer 120. The gate electrode 140 is sandwiched between the MgO layer 110 and the insulating substrate 100, and insulated from the semiconductor carbon nanotube layer 120 by the MgO layer 110.

The structure of the N-type TFT 20 is similar to the structure of the N-type TFT 10, except that the gate electrode 140 is located on the insulating substrate 100, and the MgO layer 110 is located on the gate electrode 140. The N-type TFT 20 is a bottom-gate type TFT.

Figure 7:
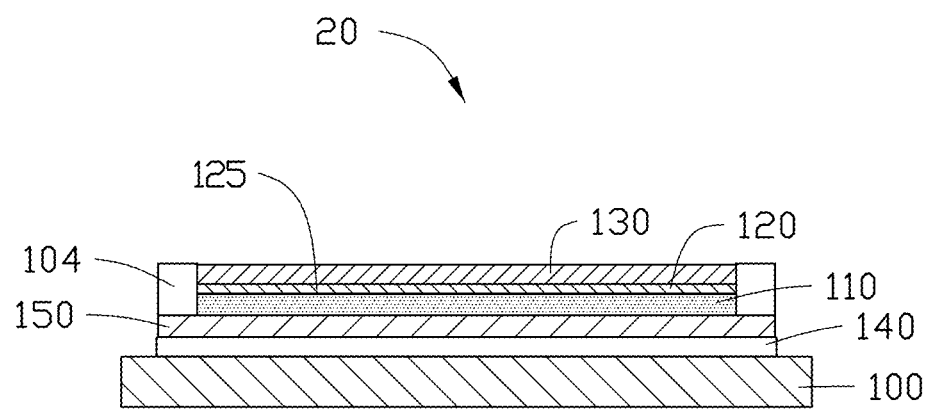
FIG. 7 is a cross-section view of one embodiment of an N-type TFT.

Referring to FIG. 7, one embodiment of an N-type thin film transistor (TFT) 30 comprises an insulating substrate 100, a gate electrode 140, an insulating layer 150, a MgO layer 110, a semiconductor carbon nanotube layer 120, and a functional dielectric layer 130 stacked together in that sequence. A source electrode 104 and a drain electrode 105 are electrically connected to the semiconductor carbon nanotube layer 120. The insulating layer 150 is sandwiched between the gate electrode 140 and the MgO layer 110 and isolates the gate electrode 140 from the semiconductor carbon nanotube layer 120.

The structure of the N-type TFT 30 is similar to the structure of N-type thin film transistor 20, except that the N-type TFT 30 further comprises the insulating layer 150 is sandwiched between the MgO layer 110 and the gate electrode 140. The insulating layer 150 isolates the source electrode 104, the drain electrode 105, and the semiconductor layer 120 from the gate electrode 140.

The insulating layer 150 can entirely cover a surface of the MgO layer 110 away from the semiconductor carbon nanotube layer 120. A material of the gate insulating layer 150 can be hard materials such as aluminum oxide, hafnium oxide, silicon nitride, or silicon oxide, the material can also be flexible material such as benzocyclobutene (BCB), acrylic resin, or polyester. A thickness of the gate insulating layer 150 ranges from about 0.5 nanometers to about 100 microns. In one embodiment, the material of the insulating layer 150 is aluminum oxide, and the thickness is about 40 nanometers.

Depending on the embodiments, certain of the steps described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure.

What is claimed is:
1. An N-type thin film transistor, comprising:
an insulating substrate;
a gate electrode on the insulating substrate;
an MgO layer on the gate electrode;
a semiconductor carbon nanotube layer on the MgO layer, wherein the semiconductor carbon nanotube layer comprises a first surface and a second surface opposite to the first surface, and the first surface is in direct contact with the MgO layer;
a functional dielectric layer on the second surface, wherein a material of the functional dielectric layer is selected from the group consisting of aluminum oxide, hafnium oxide, and yttrium oxide; and a source electrode and a drain electrode electrically connected to the semiconductor carbon nanotube layer, wherein the source electrode and the drain electrode are spaced from each other.

2. The N-type thin film transistor of claim 1, wherein a thickness of the MgO layer ranges from about 1 nanometer to about 10 nanometers.

3. The N-type thin film transistor of claim 1, wherein the semiconductor carbon nanotube layer comprises a plurality of carbon nanotubes.

4. The N-type thin film transistor of claim 1, wherein the semiconductor carbon nanotube layer consists of a plurality of semi-conductive carbon nanotubes.

5. The N-type thin film transistor of claim 1, wherein a thickness of the semiconductor carbon nanotube layer ranges from about 0.5 nanometers to about 2 nanometers.

6. The N-type thin film transistor of claim 1, wherein the semiconductor carbon nanotube layer comprises a plurality of semi-conductive carbon nanotubes connected with each other to form a conductive network.

7. The N-type thin film transistor of claim 6, wherein a percentage of the plurality of semi-conductive carbon nanotubes in the semiconductor carbon nanotube layer is greater than or equal to 66.7%.

8. The N-type thin film transistor of claim 1, wherein a thickness of the functional dielectric layer ranges from about 20 nanometers to about 40 nanometers.

9. The N-type thin film transistor of claim 8, wherein the gate electrode is insulated from the semiconductor carbon nanotube layer by the MgO layer.

10. The N-type thin film transistor of claim 1, wherein the semiconductor carbon nanotube layer is sandwiched between the MgO layer and the functional dielectric layer.

11. The N-type thin film transistor of claim 10, wherein the MgO layer entirely covers the first surface, and the functional dielectric layer entirely covers the second surface.

12. The N-type thin film transistor of claim 11, wherein the semiconductor carbon nanotube layer is sealed by the MgO layer and the functional dielectric layer.

13. An N-type thin film transistor, comprising:
an insulating substrate;
a gate electrode on the insulating substrate;
an insulating layer on the gate electrode;
an MgO layer on the insulating layer;
a semiconductor carbon nanotube layer on the MgO layer, wherein the semiconductor carbon nanotube layer comprises a first surface and a second surface opposite to the first surface, and the first surface is in direct contact with the MgO layer;
a functional dielectric layer on the second surface, wherein a material of the functional dielectric layer is selected from the group consisting of aluminum oxide, hafnium oxide, and yttrium oxide; and
a source electrode and a drain electrode electrically connected to the semiconductor carbon nanotube layer, wherein the source electrode and the drain electrode are spaced from each other.

14. The N-type thin film transistor of claim 13, wherein the insulating layer entirely covers a surface of the MgO layer away from the semiconductor carbon nanotube layer.

15. The N-type thin film transistor of claim 13, wherein the functional dielectric layer is in direct contact with the second surface and entirely covers the second surface.

* * * * *